(12) United States Patent
Wolfsteiner et al.

(10) Patent No.: US 10,866,528 B2
(45) Date of Patent: Dec. 15, 2020

(54) COMPONENT FOR A PROJECTION EXPOSURE APPARATUS

(71) Applicant: Carl Zeiss SMT GmbH, Oberkochen (DE)

(72) Inventors: Thomas Wolfsteiner, Aalen (DE); Stefan Krone, Aalen (DE); Volker Wieczorek, Neu-Ulm (DE); Lars Berger, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/458,709

(22) Filed: Jul. 1, 2019

(65) Prior Publication Data

US 2019/0324372 A1    Oct. 24, 2019

Related U.S. Application Data (63) Continuation of application No. PCT/EP2018/050735, filed on Jan. 12, 2018.

(30) Foreign Application Priority Data

Jan. 19, 2017    (DE) .................. 10 2017 200 775

(51) Int. Cl.
*G03F 7/20* (2006.01)
*G02B 17/06* (2006.01)
*G02B 26/08* (2006.01)
*H05K 1/02* (2006.01)

(52) U.S. Cl.
CPC ..... *G03F 7/70891* (2013.01); *G02B 17/0631* (2013.01); *G02B 26/0833* (2013.01); *G03F 7/7015* (2013.01); *G03F 7/70808* (2013.01); *G03F 7/70825* (2013.01);
(Continued)

(58) Field of Classification Search
CPC .. G03F 7/708; G03F 7/70808; G03F 7/70825; G03F 7/70833; G03F 7/70841; G03F 7/70883; G03F 7/70075; G03F 7/7015; G03F 7/70891; G02B 17/00;
(Continued)

(56) References Cited

U.S. PATENT DOCUMENTS 9,791,691 B2    10/2017    Waldis et al.
2008/0137307 A1    6/2008    Orr et al.
(Continued)

FOREIGN PATENT DOCUMENTS

DE    102004015929 A1 *    7/2005    ......... H01L 23/4334
DE    10 2011 006 100 A1    9/2012
(Continued)

OTHER PUBLICATIONS

German Office Action, with translation thereof, for corresponding Appl No. 10 2017 200 775.3, dated Sep. 15, 2017.
(Continued)

*Primary Examiner* — Michelle M Iacoletti
(74) *Attorney, Agent, or Firm* — Fish & Richardson P.C.

(57) ABSTRACT

A component for a projection exposure apparatus includes a printed circuit board arranged in an encapsulated housing and having electronic component parts, and a heat conducting structure for dissipating heat from the electronic component parts to an outer side of the housing.

20 Claims, 4 Drawing Sheets

(52) U.S. Cl.
CPC ...... *G03F 7/70833* (2013.01); *G03F 7/70841* (2013.01); *G03F 7/70883* (2013.01); *H05K 1/0201* (2013.01)

(58) Field of Classification Search
CPC .. G02B 17/061; G02B 17/0631; G02B 23/12; G02B 26/0833
See application file for complete search history.

(56) References Cited

U.S. PATENT DOCUMENTS

| | | |
|---|---|---|
| 2011/0007288 A1 | 1/2011 | Brinkhof et al. |
| 2016/0170201 A1 | 6/2016 | Holz et al. |

FOREIGN PATENT DOCUMENTS

| | | |
|---|---|---|
| DE | 10 2013 217 146 A1 | 3/2015 |
| WO | WO 2013/120926 A1 | 8/2013 |

OTHER PUBLICATIONS

International Search Report and Written Opinion for corresponding PCT Appl No. PCT/EP2018/050735, dated Apr. 26, 2018.

\* cited by examiner

COMPONENT FOR A PROJECTION EXPOSURE APPARATUS

CROSS-REFERENCE TO RELATED APPLICATION

The present application is a continuation of, and claims benefit under 35 USC 120 to, international application PCT/EP2018/050735, filed Jan. 12, 2018, which claims benefit under 35 USC 119 of German Application No. 10 2017 200 775.3, filed Jan. 19, 2017. The entire disclosure of these applications are incorporated by reference herein.

FIELD

The disclosure relates to a component for a projection exposure apparatus. The disclosure also relates to a method for producing a corresponding component. Moreover, the disclosure relates to an illumination optical unit and a projection optical unit for a projection exposure apparatus including at least one such component. Furthermore, the disclosure relates to a projection exposure apparatus including at least one such component. In addition, the disclosure relates to a method for producing a microstructured or nanostructured component and to a component produced according to the method.

BACKGROUND

In a lithography system, the illumination system, in particular, includes a great deal of electronics for the control of the optical components. For operation in a vacuum environment, the electronic components are usually encapsulated. An appreciable heat dissipation via convection is then difficult.

An illumination optical unit including electronic components arranged in a correspondingly encapsulated manner is known for example from WO 2013/120 926 A1.

SUMMARY

The present disclosure seeks to improve a component for a projection exposure apparatus. In particular, the present disclosure seeks to improve a component suitable for vacuum for a projection exposure apparatus with regard to the dissipation of heat from its electronic component parts.

In one aspect, the disclosure provides a component for a projection exposure apparatus. The component includes: an encapsulated housing; at least one printed circuit board arranged in the housing and having electronic component parts, wherein the electronic component parts are arranged in the housing; and a heat conducting structure for dissipating heat from the electronic component parts to an outer side of the housing. One or a plurality of vacuum-tight bushings for electrical lines and/or for connecting one or a plurality of fluid lines is or are arranged in the housing. A selected subset of the component parts and/or the printed circuit board are/is in thermally conductive contact with the heat conducting structure via thermal contact elements.

The disclosure involves embodying the component with an encapsulated housing and a heat conducting structure for dissipating heat from electronic component parts to an outer side of the housing. At least one vacuum-tight bushing for electrical lines is arranged in the housing. It is also possible to provide one or a plurality of vacuum-tight bushings for fluids, in particular for gases and/or liquids.

The component can thus substantially be arranged at any desired location in the projection exposure apparatus, in particular in the illumination optical unit or the projection optical unit. With the bushing, the component can be flexibly connected to electrical components of the projection exposure apparatus. A fluid flow, in particular a gas flow, to the interior of the housing can be controlled via further lines and bushings. This enables, in particular, a pressure stabilization of the pressure in the interior of the housing. A further fluid line can be provided for connecting a cooling liquid, in particular for a cooling water connection.

It has been found that the arrangement of electronic component parts in a projection exposure apparatus can be considerably improved with such a housing. The component enables, in particular, the use and the flexible arrangement of electrical or electronic assemblies with a higher power density.

The component can be a constituent part of a control device for displacing an optical component, in particular a mirror, of the projection exposure apparatus. In particular, control electronics, for example sensor electronics and/or actuator electronics, can be arranged in the housing.

However, the component can also be a component which is not directly concerned with the displacement of an optical component. By way of example, a computing unit, in particular a digital computing unit, for multiplexing signals can be involved. Further examples are electronic assemblies which detect and/or process ambient conditions within the machine (temperature, pressure, gas composition, etc.) or the state of machine components (temperature, expansion/distortion, cracking). Further examples are electronic assemblies for converting currents and voltages.

The housing of the component can be embodied in particular separately from the holding structures for arranging the optical components in the beam path of the projection exposure apparatus. It can be decoupled in particular from the mirrors of the projection exposure apparatus.

The heat conducting structure can include metallic elements. It can also include nonmetallic elements, in particular electrically insulating elements.

The heat conducting structure is arranged in particular in the encapsulated housing. The heat conducting structure can be cooled actively, for example with a cooling medium, from outside. It is thermally connected in particular to the housing.

The housing can be produced from metal, in particular steel. The housing is embodied in particular in a highly polished fashion on its outer side. The outer surface of the housing has in particular an average roughness $R_a$ in the range of 0.5 µm to 2 µm, preferably of at most 1 µm.

The housing, for receiving the heat conducting structure, can be embodied in a manner appropriately matching the latter. It can have in particular a region which constitutes a negative image of a region of the heat conducting structure. It can also mirror the heat conducting structure.

The housing can also be a ceramic printed circuit board or include ceramic printed circuit boards into which metals are sintered which can be used inter alia to produce an encapsulated atmosphere on the ceramic printed circuit board. The sealing surface can also lie on the printed circuit board. A sintered metal sealing surface is also appropriate as sealing surface. The housing can be sealed vis-à-vis the vacuum via sealing cords, O-rings or other sealing techniques. The housing can also be welded in order to be able to ensure a hermetic seal. The housing can include inter alia connections for introducing and discharging gases and/or liquids.

The printed circuit board can be populated on one side or on both sides. The electronic component parts from which heat is intended to be dissipated are bonded, soldered or adhesively bonded in particular onto the printed circuit board. In this case, the soldering surfaces form in particular a constituent part of the thermal path for dissipating the heat.

In accordance with one aspect of the disclosure, the printed circuit board forms a constituent part of the heat conducting structure. The thermal conductivity of the printed circuit board is 0.01 W/m*K, in particular at least 0.05 W/m*K, in particular more than 0.3 W/m*K, in particular more than 1 W/m*K, in particular more than 3 W/m*K, in particular more than 5 W/m*K, in particular more than 10 W/m*K, and in particular more than 100 W/m*K. These indications relate to at least one spatial direction. They relate in particular to all three spatial directions.

The printed circuit board includes in particular one or a plurality of thermally conductive layers. The thermally conductive layers can be composed of an electrically conductive material or an electrically insulating material. In particular, the following materials are appropriate as materials for the layers of the printed circuit board: copper, aluminium, gold, tin, lead or compounds thereof and also FR4, ceramics or the material of flexible conductors, for example polyamide. The printed circuit board can also include a plurality of layers composed of different materials.

The printed circuit board can be thermally connected in particular to a heat sink.

The printed circuit board forms in particular a constituent part of the thermal path from the electrical and/or electronic component parts of the component to the heat sink.

In accordance with a further aspect of the disclosure, the printed circuit board has heat spreading regions. It is thereby possible for heat of individual electronic component parts that arises in a punctiform fashion to be distributed in a planar fashion and/or to be conducted to regions from which the heat can be dissipated.

The heat spreading regions are embodied in particular in a planar fashion.

In accordance with one aspect of the disclosure, provision is made for layers of the printed circuit board which have a fixed electrical potential during operation of the electronic components to be embodied as thick copper layers, in particular as layers having a high proportion of copper and a thickness of at least 5 µm, in particular at least 50 µm. A plurality of layers can be thermally and also electrically connected via e.g. thermal vias or electrical vias. By virtue of this circumstance, the heat can be spread by way of a plurality of layers and planes of the printed circuit card. After the spreading of the heat at the place of origination, for example an electrical component part, the heat can be transferred into different layers via the vias or other thermally conductive structures. The heat flow to the heat conducting structure then takes place by way of the different layers, which has the consequence that the thermal resistance can be reduced. Near the heat conducting structure, the heat can be transferred once again with the aid of vias, for example, to the surface which is connected to the heat conducting structure.

In accordance with a further aspect of the disclosure, the printed circuit board is embodied in a multilayered fashion with a plurality of layers and a thermal path of at least one of the electronic component parts is decoupled from an electrically conductive path thereof. This can be achieved via a galvanic isolation, in particular by using electrically nonconductive layers as part of the thermal path.

In accordance with a further aspect of the disclosure, the printed circuit board is electrically insulated from the housing. The housing can be earthed, in particular.

In accordance with a further aspect of the disclosure, a selected subset of the component parts and/or the printed circuit board are/is in thermally conductive contact with the heat conducting structure via thermal contact elements. In particular, so-called gap fillers, gap pads, thermally conductive pads, thermally conductive cushions, a thermally conductive mat, thermally conductive adhesives, thermally conductive pastes, thermally conductive elastomers, a thermally conductive compound, a thermally conductive potting compound or others serve as thermal contact elements.

The heat conduction to the heat conducting structure can be improved via such contact elements. Moreover, the contact elements enable simpler production of the component.

The contact elements can be composed of an electrically insulating material or of an electrically conductive material. They are composed, in particular, of a mechanically flexible and/or elastic material. Possible materials are silicone-containing elastic contact materials; non-silicone-containing elastic materials are preferred for use on important optical units. Furthermore, metallic contact materials can also be used. Further materials are phase change materials and/or graphite films and/or laminates and/or curable materials such as adhesives, potting compounds, etc. (see above).

It is advantageous, in particular, if the mechanical properties of the contact elements enable the latter to be pressed. This results in simpler integration. Moreover, it enables a compensation of manufacturing tolerances of the printed circuit board and heat conducting structure. In this case, it is possible, in particular, during the production of the component, firstly to apply the thermal contact elements on the already populated printed circuit board, for example by placement, adhesive bonding or spraying, and then to bring the latter into position and/or shape by connecting the printed circuit board to the heat conducting structure, for example by screwing together these two elements.

In accordance with one aspect of the disclosure, this takes account of the fact that the thermal resistance of the thermal contact elements is dependent on the pressing pressure applied to them.

Pressure-sensitive components can also be linked to the heat conducting structure via curable contact materials.

The contact elements can be applied on the printed circuit board via a device. They can also be applied on e.g. the heat conducting structure via a device. The printed circuit board and the contact element themselves can have alignment edges, fitting holes or associated slots which can be used to align the contact element with the respective component part.

The heat conducting structure can contain cutouts into which the contact element is incorporated or applied.

In accordance with a further aspect of the disclosure, the printed circuit board can form a constituent part of the housing. This enables particularly simple and efficient linking of the printed circuit board to external components, in particular signal lines and/or a cooling device.

In accordance with a further aspect, the disclosure relates to an encapsulated electronic component in a vacuum environment of a projection exposure apparatus. The electronic component includes one or a plurality of, in particular multilayered, printed circuit boards. The printed circuit boards can be embodied in particular as planar printed circuit boards. They can be formed from FR4, in particular. They can be arranged in particular completely within the closed housing. The printed circuit boards are populated in particular with components. They have heat conducting structures for thermal linking to the housing. In addition thereto, the housing can have a ceramic printed circuit board, in particular having cutouts for heat conducting surfaces, as a housing seal.

The disclosure also seeks to provide a method for producing a component according to the description above.

Individual method steps which can be used for producing the component are specified in an outline summary below. The method steps need not necessarily all be used. In particular, they need not be implemented in the order indicated.

Manufacturing at least one printed circuit board with populated component parts (soldered, bonded, adhesively bonded). The printed circuit board and/or the populated components have thermal contact surfaces.

Securing the printed circuit board(s) to the housing. Securing further heat conducting structures on the printed circuit board and/or to the housing. Specific alignment elements, for example in the form of pins, can be provided for aligning the printed circuit board relative to the housing. The pinlike alignment elements can be arranged in particular fixedly at the housing. The printed circuit board can include a slot and/or a fitting hole matching the alignment elements.

Producing an electrical connection between a plurality of printed circuit boards, for example via cables, flexible connectors, other printed circuit boards.

Producing an electrical connection of printed circuit board (s) to electrical plug connectors leading out of the housing, for example via cables, flexible connectors, other printed circuit boards.

Applying heat conducting materials on the printed circuit board and/or electronic component parts mounted thereon, and/or on additional heat conducting structures which are to be ascribed to the housing, and/or on the housing. The heat conducting materials can be aligned relative to the printed circuit board and/or relative to the housing via fitting holes and/or fitting slots.

Closing, in particular hermetically closing off, the housing via the seals, adhesives and/or screw joints.

The assembly is electrically and/or mechanically connected to optical components.

The assembly can be connected to media connections, in particular for gases and/or liquids.

Method steps which can be provided, in particular, if the printed circuit board simultaneously forms a constituent part of the housing are specified in an outline summary below.

The printed circuit board, in particular a ceramic substrate thereof, is pressed together with metal inlets. The metal inlets can be used for realizing a seal. However, the sealing surface can also be realized on the ceramic substrate.

The printed circuit card is sintered. After this process, the sealing surfaces can be post-processed (on the metal inlets or on the ceramic printed circuit card).

The printed circuit card is populated with electrical component parts. The electrical component parts are positioned within the closed-off housing provided, since this space is separated from the vacuum present later, which is harmful to the electrical component parts.

The interior of the housing is then sealed. This can be realized via sealing rings, sealing cords, metal seals, welding, etc.

Further, the disclosure seeks to provide an improved illumination optical unit and/or a projection optical unit for a projection exposure apparatus, and/or a microlithographic projection exposure apparatus. This can be achieved via an illumination optical unit, a projection optical unit and a projection exposure apparatus including at least one component in accordance with the description above.

The advantages are evident from those of the component.

The projection exposure apparatus is an EUV projection exposure apparatus, in particular.

The illumination optical unit and/or the projection optical unit are arranged in a vacuum environment, in particular, or have evacuatable regions.

The at least one component in accordance with the description above is arranged in particular in a vacuum environment.

In addition, the disclosure seeks to provide an improved a method for producing a microstructured or nanostructured component, and a correspondingly produced component.

This can be achieved by the provision of a projection exposure apparatus including at least one component in accordance with the description above. The advantages are evident from those already described.

BRIEF DESCRIPTION OF THE DRAWINGS

Further details and advantages of the disclosure will become apparent from the description of exemplary embodiments with reference to the figures, in which.

DESCRIPTION OF EXEMPLARY EMBODIMENTS

First of all, the basic construction of a projection exposure apparatus 1 is described below with reference to the figures.

Figure 1:
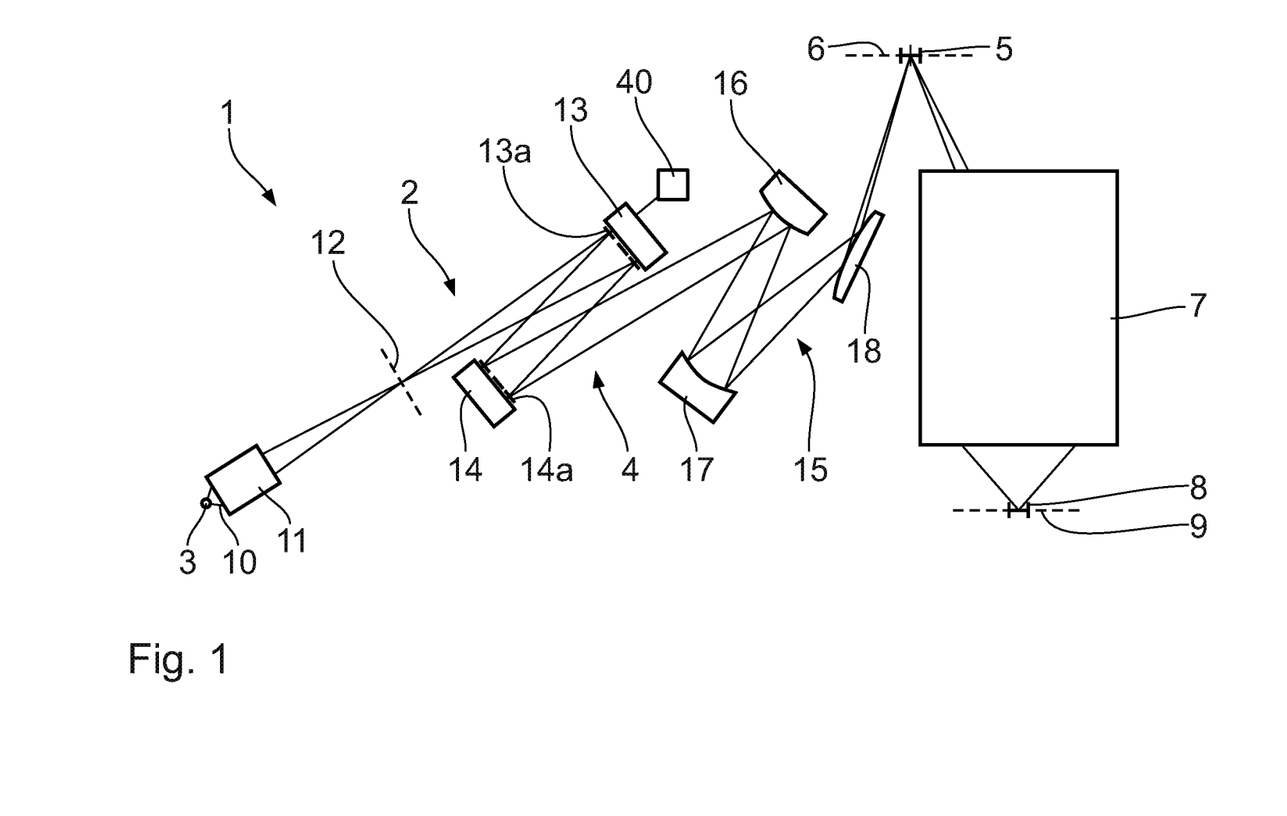
FIG. 1 shows a schematic illustration of microlithography with an illumination system and a projection optical unit in meridional section.

FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle 24 (not illustrated in FIG. 1) arranged in the object field 5 is exposed, the reticle bearing a structure to be projected by the projection exposure apparatus 1 for the production of micro- or nanostructured semiconductor components. A projection optical unit 7 serves for imaging the object field 5 into an image field 8 in an image plane 9. The structure on the reticle 24 is imaged onto a light-sensitive layer of a wafer, which is not illustrated in the drawing and is arranged in the region of the image field 8 in the image plane 9.

The reticle 24, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle 24 to be scanned in the opposite direction relative to the wafer.

With the aid of the projection exposure apparatus 1, at least one part of the reticle 24 is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle 24 and the wafer are moved in a temporally synchronized manner in the y direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14a. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors. In this case, the subdivision of the field facet mirror 13 into individual mirrors can be such that each of the field facets 13a which illuminate the entire object field 5 by themselves is represented by exactly one of the individual mirrors. Alternatively, it is possible to construct at least some or all of the field facets 13a using a plurality of such individual mirrors. The same correspondingly applies to the configuration of the pupil facets 14a of the pupil facet mirror 14, which are respectively assigned to the field facets 13a and which can be formed in each case by a single individual mirror or by a plurality of such individual mirrors.

The EUV radiation 10 is incident on the two facet mirrors 13, 14 at an angle of incidence that is less than or equal to 25°, measured in relation to the normal to the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet 13a of the field facet mirror 13 and a pupil facet 14a of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets 14a to the field facets 13a and correspondingly a changed configuration of the illumination channels can be achieved. This results in different illumination settings, which differ in the distribution of the illumination angles of the illumination light 10 over the object field 5.

The displacement of the individual mirrors of the field facet mirror 13 can be controlled via a component 40, which is described in even greater detail below. The component 40 forms, in particular, a constituent part of a control device.

Figure 2:
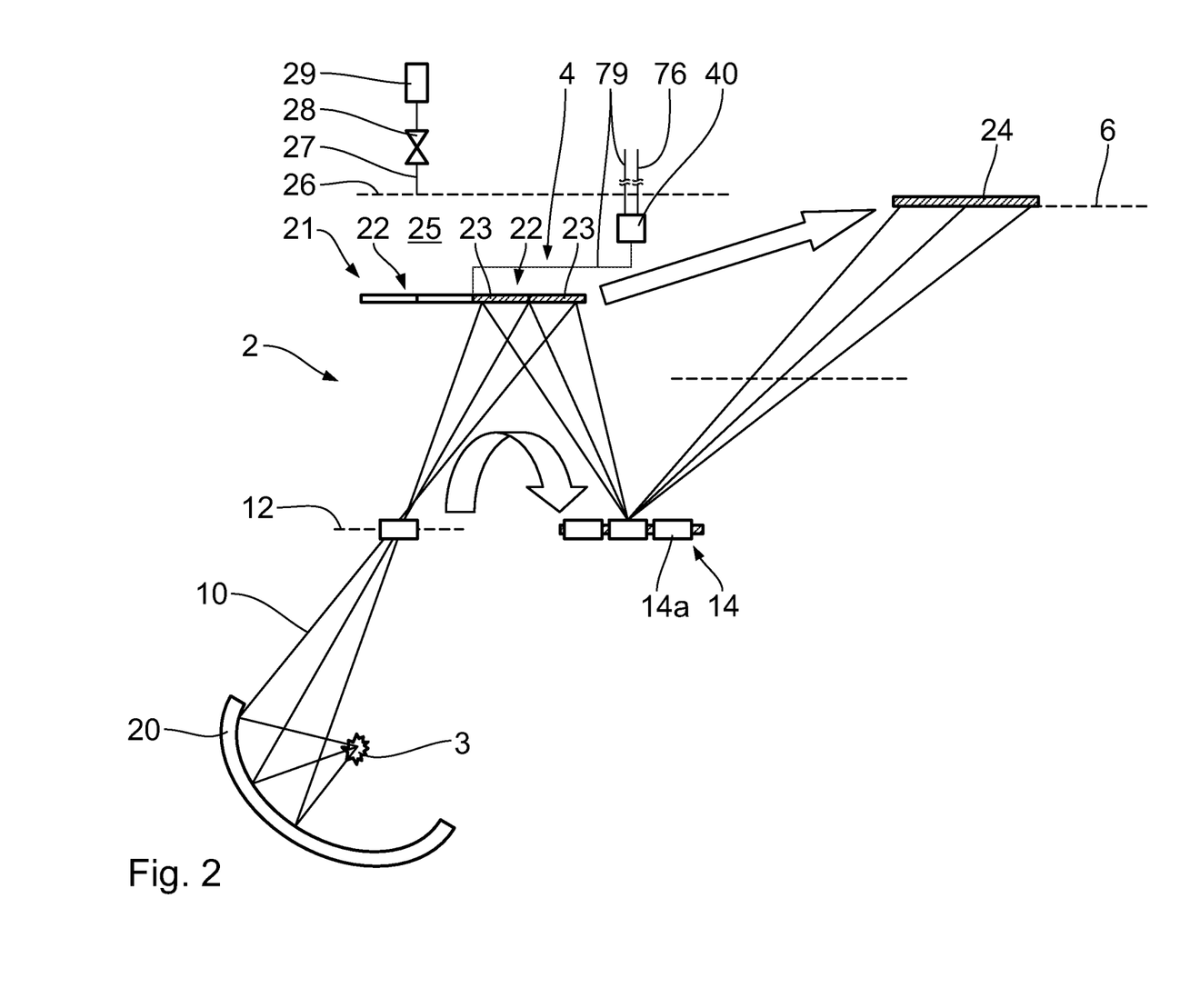
FIG. 2 shows one embodiment of an illumination system of a projection exposure apparatus including a mirror array (MMA) and a pupil facet mirror illuminated by the latter.

FIG. 2 shows an alternative configuration of an illumination system 2 for the projection exposure apparatus 1. Components corresponding to those which have already been explained above with reference to FIG. 1 bear the same reference numerals and will not be discussed in detail again.

Used radiation 10 emerging from the radiation source 3, which can likewise be embodied as an LPP source, is firstly collected by a first collector 20. The collector 20 can be a parabolic mirror which images the radiation source 3 into the intermediate focal plane 12 or focuses the light from the radiation source 3 onto the intermediate focus in the intermediate focal plane 12. The collector 20 can be operated in such a way that the used radiation 10 impinges on it at angles of incidence near 0°. The collector 20 is then operated near normal incidence and is therefore also referred to as a normal incidence (NI) mirror. A collector operated with grazing incidence can also be used instead of the collector 20.

A field facet mirror 21 in the form of a multi- or micro-mirror array (MMA) as an example of an optical assembly for guiding the used radiation 10, that is to say the EUV radiation beam, is disposed downstream of the intermediate focal plane 12. The multi-mirror or micro-mirror array (MMA) is also referred to merely as a mirror array 22 in the following text. The field facet mirror 21 can be embodied as a microelectromechanical system (MEMS). In this case, it has a multiplicity of individual mirrors arranged in a matrix-like manner in rows and columns in an array. In the following text, the individual mirrors are also referred to as mirror elements 23. The mirror elements 23 are designed to be tiltable by an actuator system, as will be explained below. If the field facet mirror 21 is embodied as a MEMS, it has approximately 100 000 of the mirror elements 23. Depending on the size of the mirror elements 23, the field facet mirror 21 can also have for example 1000, 5000, 7000 or else hundreds of thousands of mirror elements 23, for example 500 000. It can also have fewer than 1000, for example 100 to 500, mirror elements 23.

A spectral filter can be arranged upstream of the field facet mirror 21 and separates the used radiation 10 from other wavelength components of the emission of the radiation source 3 that are not usable for the projection exposure. The spectral filter is not illustrated.

The field facet mirror 21 is impinged on by used radiation 10 having a power of 840 W and a power density of 6.5 kW/m². The used radiation 10 can also have a different power and/or power density.

The used light 10 is reflected by the mirror elements 23 of the facet mirror 21 towards the pupil facet mirror 14. The pupil facet mirror 14 has approximately 2000 static pupil facets 14a. The latter are arranged alongside one another in a plurality of concentric rings, such that the pupil facet 14a of the innermost ring is fashioned in a sector-shaped manner and the pupil facets 14a of the rings directly adjacent thereto are fashioned in a ring-sector-shaped manner. In a quadrant of the pupil facet mirror 14, 12 pupil facets 14a can be present alongside one another in each of the rings. Each one of the pupil facets 14a can be embodied as a mirror array 22.

The used light 10 is reflected by the pupil facets 14a towards a reflective reticle 24 arranged in the object plane 6. The projection optical unit 7 then follows, as explained above in connection with the projection exposure apparatus according to FIG. 1.

A transfer optical unit 15 can once again be provided between the facet mirror 14 and the reticle 24, as explained above in connection with the illumination optical unit 4 according to FIG. 1.

As is indicated schematically in FIG. 2, the mirror elements 23 of the illumination optical unit 4 are housed in an evacuable chamber 25. FIG. 2 only schematically indicates a boundary wall 26 of the evacuable chamber 25. The chamber 25 communicates with a vacuum pump 29 via a fluid line 27, in which a shutoff valve 28 is accommodated. The operating pressure in the evacuable chamber 25 is a few Pa (partial pressure of $H_2$). All other partial pressures are significantly below $10^{-7}$ mbar.

Generally, the component 40 includes electrical and/or electronic component parts that are arranged on one or a plurality of printed circuit boards. The component 40 includes a housing 60, in particular. The housing 60 is embodied in an encapsulated fashion, in particular. The component 40 includes moreover a heat conducting structure 68 for dissipating heat from the housing 60, in particular for dissipating heat from the electrical and/or electronic components on the printed circuit boards.

Aspects and details of the component 40 are described by way of example below.

Via the present disclosure it is generally possible to lead the power loss of various electrical components, for example also from inductances, from arbitrary, in particular planar, wiring carriers to the housing 60 or to lead the power loss out of the housing 60. The wiring carriers can include in particular one or a plurality of layers, in particular also composed of FR4, flexible PCB or similar materials.

The wiring carrier can be connected to the housing 60 at various locations. It can be connected to the housing 60 in particular mechanically and/or thermally at various locations. It is possible, in particular, to screw the wiring carrier to the housing 60. Screw joints at different receiving points, in particular also on a cooling structure in the middle of the housing 60, are conceivable.

As already mentioned, the electronic assembly in the encapsulated housing need not necessarily be directly involved in the positioning of the mirror elements 23.

The mirror elements 23 can be micromirrors. Macroscopic mirrors can also be involved. The description of the ASICs 52 should correspondingly also be understood to be by way of example. The ASICs 52 form one specific example of a more general electronic assembly realized in a discrete fashion.

Further properties of the component 40, in particular the arrangement of electronic component parts 61 in the housing 60, are described below with reference to FIG. 4.

Figure 3:
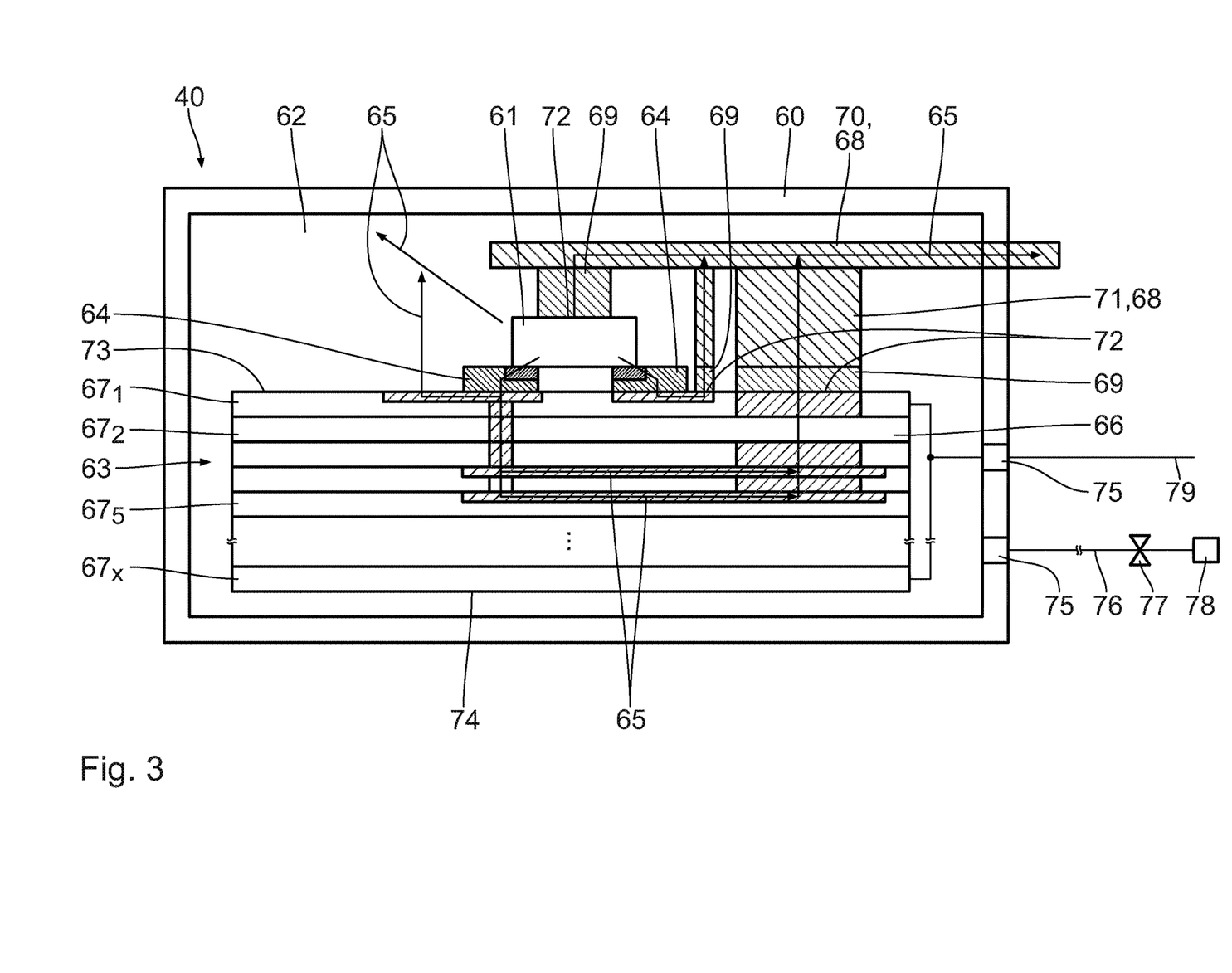
FIG. 3 shows a schematic illustration of an encapsulated arrangement of a printed circuit board of the optical component in accordance with FIG. 2.

The alternative illustrated schematically in FIG. 3 should likewise be understood to be by way of example. It shows an alternative of the component 40 as a self-contained, separate component 40.

The housing 60 is embodied in an encapsulated fashion. It encloses in particular an interior 62 in a vacuum-tight manner. The housing 60 can be embodied in particular as a self-contained housing. The component 40 can thus be embodied as a self-contained, separate component 40. It can be mechanically decoupled in particular from the optical components of the projection exposure apparatus 1. The component 40 illustrated in FIG. 4 can also be electrically and/or mechanically connected to one or a plurality of optical components of the projection exposure apparatus 1.

A printed circuit board 63 is arranged in the housing 60.

Component parts, in particular the electronic component parts 61, are arranged on the printed circuit board 63. The electronic component parts 61 are electrically conductively connected to the printed circuit board 63 in particular via soldering contacts 64. The soldering contacts 64 also lead to a thermal linking of the electronic component parts 61 to the printed circuit board 63.

Bushings 75 are arranged in the housing 60. The upper bushing 75 illustrated schematically in FIG. 4 serves for leading electrical lines 79 through it. It is preferably demountable. It is able to be closed off in particular in a vacuum-tight manner. The bushing 75 for the electrical lines 79 can also be embodied as an interface, in particular as a contact plug.

The lower bushing 75 illustrated schematically in FIG. 3 serves for connecting a fluid line, in particular a gas line, 76. The gas line 76 is connected to a pressure generating device 78, in particular an excess pressure reservoir, via a controllable valve 77. It is thereby possible, in particular, to keep the pressure in the interior 62 of the housing 60 at at least 0.1 bar, in particular at least 0.3 bar, in particular at least 0.5 bar, even if the component 40, in particular the housing 60, is arranged in a vacuum environment.

Preferably, the bushing 75 for connecting the gas line 76 is also demountable. It is likewise able to be closed off in particular in a vacuum-tight manner.

A thermal path 65 of the component part 61 is depicted schematically in FIG. 3. The thermal path 65 includes a plurality of branch paths. It can be decoupled from an electrical path via galvanic isolation in particular in the printed circuit board 63. Electrically non-conductive layers 66 in the printed circuit board 63 can be used for this purpose. The layers 66 are composed, in particular, of an electrically insulating material, for example FR4. They can also be composed of ceramic or a flexible conductor material, for example poly-amide. Other materials are likewise possible.

Figure 4:
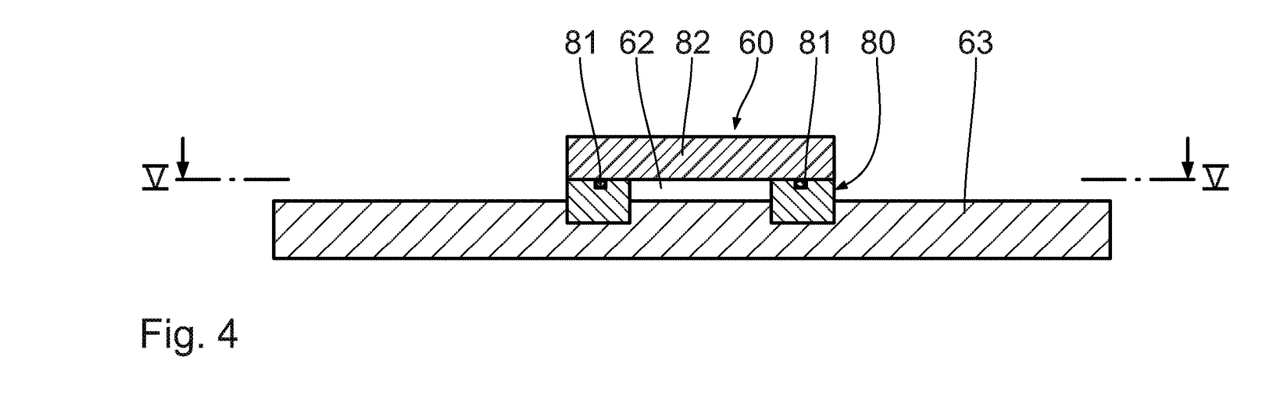
FIG. 4 shows a schematic sectional illustration of an alternative in which the printed circuit board itself forms a constituent part of the housing.

The branches of the thermal path 65 that are illustrated schematically in FIG. 4 can be provided in each case individually or in combination with one another.

Generally, the printed circuit board 63 preferably has a multilayered structure. The number of layers is in particular more than 1, in particular more than 3, in particular more than 9. See above (thickness, material).

As is illustrated schematically in FIG. 3, the printed circuit board 63 itself, in particular individual layers 67 thereof, serves as a heat conductor. Provision is made, in particular, for regions of the printed circuit board 63 or of specific layers 67 thereof to be embodied as heat spreading elements via which heat of the component part 61 that arises in a punctiform fashion is distributed in a planar fashion and/or is conducted to points at which the heat is dissipated.

Moreover, a heat conducting structure 68, also referred to as a cooling structure, is arranged in the housing 60. The heat conducting structure 68 includes in particular a metallic cooler via which heat that arises can be led out of the encapsulated interior 62 of the housing 60.

The heat conducting structure 68 can also be composed—at least partly—of an electrically insulating material. The heat conducting structure can be produced from one or more of the following materials: copper, aluminium, high-grade steel, solder for connecting two metallic materials, other metals and/or alloys, plastics, in particular glass-fibre-reinforced plastics, resins, in particular epoxy resins, in particular in a composite, for example FR4, ceramic or a combination of these materials. This list should be understood not to be exhaustive. Other materials are likewise conceivable.

The heat conducting structure 68 can include one or a plurality of plate-shaped regions 70. Rib- or weblike heat conducting elements 71 can be arranged on the plate-shaped regions 70. The rib- or weblike elements 71 can be embodied integrally with the plate-shaped region 70.

The plate-shaped regions 70 of the heat conducting structure can be soldered to the printed circuit board 63. They can also be screwed to the printed circuit board 63. The printed circuit board 63 can form a constituent part of the heat conducting structure 68.

The plate-shaped regions 70 and/or the heat conducting elements 71 are in thermally conductive contact with the printed circuit board 63 and/or the component part 61 by way of thermal contact elements 69.

The thermal contact element 69 can be embodied as a so-called gap filler or gap pad, thermally conductive pad, thermally conductive cushion or thermally conductive mat or can include one or a plurality of such elements. It can also be produced from a thermally conductive adhesive, a thermally conductive paste, a thermally conductive elastomer or a thermally conductive compound, in particular a thermally conductive potting compound.

The contact elements 69 can also be embodied as metallically resilient pressure pieces. They can optionally be provided with a thermally conductive paste or another of the abovementioned heat conducting elements at the contact locations.

The thermal contact elements 69 preferably have a certain mechanical flexibility. They are preferably able to be pressed, in particular. This facilitates the integration of the thermal contact elements 69.

The mechanical properties of the contact elements depend on the constitution of the component parts to be linked (electrical components, printed circuit board, also two mechanical components to one another). Configurations having an air gap can also occur in a manner dictated by tolerances. Moreover, it may be the case that no interface material at all need be used and the component is mounted directly onto the carrier (air gap is possible). Furthermore, it is also possible to completely dispense with the linking via interface materials, in particular if the complete housing is flushed via an electrically insulating liquid, for example 3M™ Novec™ or transformer oil. The liquid can then be guided in a region outside the vacuum (single-phase cooling, e.g. Iceotope Server Module) and be connected to a heat exchanger that dissipates the power loss. The advantages here are the avoidance of hot spots and a more uniform temperature distribution in the system.

The thermal contact elements 69 can be integrated in particular in such a way that they are firstly applied, for example placed, adhesively bonded or sprayed, on the populated printed circuit board 63. They can then be brought to the position and/or shape for realizing the desired thermal linking by the printed circuit board 63 being connected to the heat conducting structure 68, for example by these two elements being screwed together.

It is possible, in particular, to spatially separate one or more of the component parts 61 from other component parts, not illustrated in FIG. 4, via the heat conducting structure 68. Via the heat conducting structure 68 it is possible to form in particular on the printed circuit board 63 separate partial regions each delimited in a vacuum-tight manner.

An alternative of the disclosure is described below with reference to FIGS. 4 and 5. For general details of this alternative, reference should be made to the description above.

Figure 5:
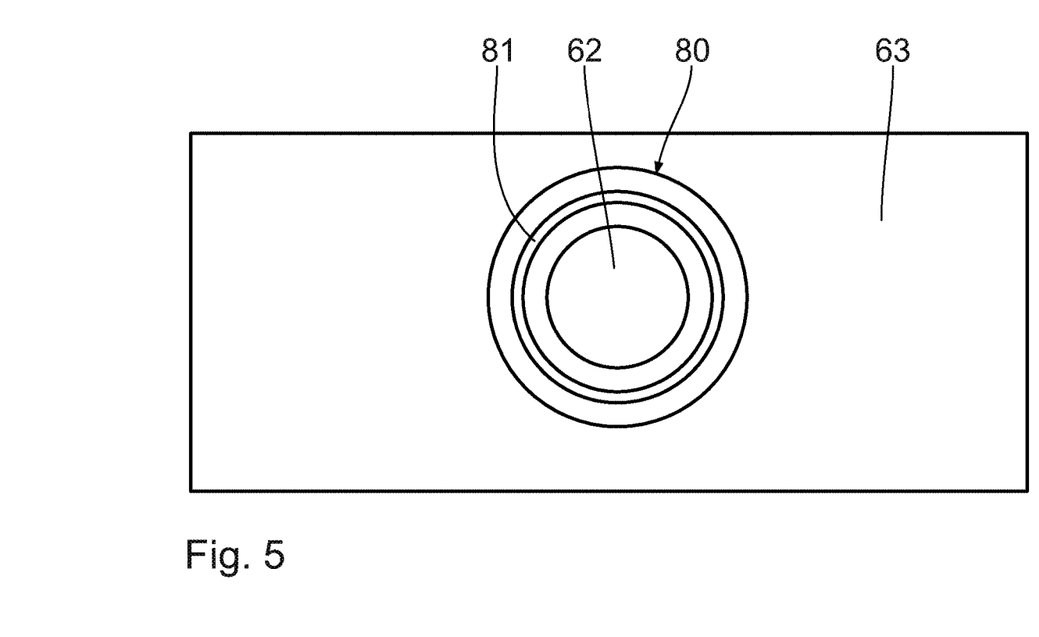
FIG. 5 shows a view of the alternative in accordance with FIG. 4 along the line V-V.

In the case of the alternative illustrated in FIGS. 4 and 5, the printed circuit board 63 itself forms a constituent part of the housing 60.

A metal ring 80 is introduced into the printed circuit board 63. The metal ring 80 is sintered in particular into the printed circuit board 63.

The metal ring 80 can have a sealing surface. It can also be embodied without a sealing surface.

As is illustrated schematically and by way of example in the figures, an O-ring 81 as sealing ring is integrated into the metal ring 80. The O-ring 81 can be inserted and pressed. It can in particular be placed onto the metal ring 80 or be inserted into the latter. It enables the interior 62 to be closed off in a sealed manner, in particular in a vacuum-tight manner, with the aid of a cover 82. The cover 82 can be composed of ceramic or of metal.

In accordance with one alternative, the housing 60 is embodied without the O-ring 81. In this case, the cover 82 can be welded in particular to the metal ring 80.

Depending on the dimensions of the interior 62, stiffening elements can be provided therein. It is thereby possible to prevent a deformation of the component 40 in the event of a pressure difference between the interior 62 and the environment surrounding the housing 60.

Electronic component parts are arranged on the printed circuit board 63 in turn in the interior 62 of the housing 60. These are not illustrated in FIGS. 4 and 5.

As is illustrated schematically in FIGS. 4 and 5, the printed circuit board 63 can additionally have regions which are not closed off in a vacuum-tight manner.

The alternative illustrated in FIGS. 4 and 5 enables particularly simple dissipation of heat from the interior 62 closed off in a vacuum-tight manner.

Various features and advantages of the disclosure will be described once again in an outline summary below.

With the aid of the heat conducting structure 68 it is possible to ensure a high heat dissipation in accordance with the design of the structure. The heat dissipation is more than 0.1 watt, in particular more than 10 watts, in particular more than 100 watts, in particular more than 1000 watts, per component. This makes it possible to use component parts having a high power loss, in particular component parts having a high heat emission, in an encapsulated environment.

Cooling via a gas or fluid flow can be dispensed with within the housing since the dissipation of heat from the electronic component parts is realized predominantly in a conductive fashion rather than in a convective fashion. In particular, it is possible to dispense with openings enabling a flow of gas or fluid in the housing 60. The structural outlay is thereby reduced. Moreover, the risk of formation of leaks is thereby avoided.

However, preference is given to an alternative in which a fluid flow serves for dissipating heat from the housing 60, in particular from the interior 62 thereof. For this purpose, cooling pipes (not illustrated in the figures) can be led through the housing 60 and/or along the outer wall thereof. In this case, the power loss is guided in particular conductively as far as the cooling pipes. It is carried away from the housing 60 with the aid of the fluid flow. In principle, a cooling pipe for a cooling fluid, in particular a cooling gas and/or a cooling liquid, to pass through can also be provided in the printed circuit board 63.

The component parts 61 can be linked to the heat conducting structure 68 directly or indirectly via thermal contact elements 69.

The component parts 61 can be linked to structures for heat spreading within the printed circuit board 63.

The component parts 61 can be arranged directly or indirectly on structures for conducting heat within the printed circuit board 63.

The printed circuit board 63 can be linked to the heat conducting structure 68 directly or indirectly via thermal contact elements 69.

The use of thermally conductive interface materials having a low thermal resistance makes it possible to improve the heat transfer from the printed circuit board 63 and/or the component part 61 to the heat conducting structure 68.

The thermal path 65 can be decoupled from the electrical path of the component part 61 via a galvanic isolation by electrically non-conductive layers 66. It is thereby possible to isolate the electrical potential of the heat conducting structure 68 from the potential of the electrical linking of the component parts 61.

The heat conducting structure 68 can be actively cooled, in principle. In particular, a coolant, in particular a cooling gas or a cooling fluid, can flow through the heat conducting structure.

The printed circuit board 63 and the heat conducting structure 68 are in particular mechanically connected, for example screwed, to one another. They are connected to one another in particular at regular intervals. A substantially homogeneous contact pressure can thereby be ensured.

The thermal contact elements 69 are preferably compressible and/or resilient. They are preferably silicone-free. They are preferably self-adhesive. They preferably have a geometry which, in the integrated state, corresponds to the thermally active bearing surfaces 72 of the thermally linked component parts 61 or of the printed circuit card surfaces.

It is also possible for a plurality of heat conducting structures 68 to be arranged in the housing 60. It is possible, in particular, for the printed circuit board 63 to be thermally linked to the heat conducting structure 68 on one side or on two sides.

It is possible in particular to arrange one or a plurality of heat conducting structures 68 on the front side 73 and/or the rear side 74 of the printed circuit board 63.

The geometries of the thermal links, in particular of the bearing surfaces 72, can be flexibly adapted to the desired design of the printed circuit board 63 and/or of the component parts 61.

What is claimed is:

1. A component, comprising:
    an encapsulated housing having an interior and an exterior;
    a multi-layered printed circuit board comprising electronic component parts inside the interior of the encapsulated housing;
    a heat conducting structure configured to dissipate heat from the electronic component parts to the exterior of the encapsulated housing;
    a vacuum-tight bushing in the encapsulated housing; and
    thermal contact elements,
    wherein:
        the vacuum tight bushing is configured to connect into the encapsulated housing at least one member selected from the group consisting of a fluid line and an electrical line;
        at least one member selected from the group consisting of a subset of the component parts and the multi-layered printed circuit board is in thermally conductive contact with the heat conducting structure via the thermal contact elements; and
        for at least one of the electronic component parts:
            the electronic component part has a thermal path for transferring heat from the electronic component part to the exterior of the encapsulated housing via the heat conducting structure;
            the electronic component part has an electrical path; and
            the thermal path of electronic component part is decoupled from the electrical path of the electronic component part.

2. The component of claim 1, wherein the multi-layered printed circuit board is a constituent part of the heat conducting structure.

3. The component of claim 2, wherein the multi-layered printed circuit board comprises heat spreading regions.

4. The component of claim 2, wherein the multi-layered printed circuit board is electrically insulated from the encapsulated housing.

5. The component of claim 2, wherein the thermal contact elements comprise an electrically insulating material.

6. The component of claim 2, wherein the thermal contact elements comprise an electrically conductive material.

7. The component of claim 2, wherein the contact elements comprise a mechanically flexible and/or elastic material.

8. The component of claim 1, wherein the multi-layered printed circuit board comprises heat spreading regions.

9. The component of claim 1, wherein the multi-layered printed circuit board is electrically insulated from the encapsulated housing.

10. The component of claim 1, wherein the thermal contact elements comprise an electrically insulating material.

11. The component of claim 1, wherein the thermal contact elements comprise an electrically conductive material.

12. The component of claim 1, wherein the contact elements comprise a mechanically flexible and/or elastic material.

13. An illumination optical unit, comprising:
    a component according to claim 1,
    wherein the illumination optical unit is a microlithographic illumination optical unit.

14. A projection optical unit, comprising:
    a component according to claim 1,
    wherein the projection optical unit is a microlithographic projection optical unit.

15. An apparatus, comprising:
an illumination optical unit comprising a component according to claim 1; and
a projection optical unit,
wherein:
at least one member selected from the group consisting of the illumination optical unit and the projection optical unit comprises a component according to claim 1; and
the apparatus is a microlithographic projection exposure apparatus.

16. The apparatus of claim 15, wherein the illumination optical unit comprises a component according to claim 1.

17. The apparatus of claim 16, wherein the projection optical unit comprises a component according to claim 1.

18. The apparatus of claim 15, wherein the projection optical unit comprises a component according to claim 1.

19. A method, comprising:
providing a multi-layered printed circuit board comprising electronic component parts;
securing the multi-layered printed circuit board to an encapsulated housing such that the electronic component parts are inside the encapsulated housing;
applying thermal contact elements on regions of at least one member selected from the group consisting of the multi-layered printed circuit board, the electronic component parts and an interior of the encapsulated housing; and
closing off the interior of the encapsulated housing in a vacuum-tight manner a vacuum-tight bushing, thereby providing a component according to claim 1.

20. A method of using a microlithographic projection exposure apparatus which comprises an illumination optical unit and a projection optical unit, the method comprising:
using the illumination optical unit to illuminate structures of a reticle;
using the projection optical unit to project at least a part of the illuminated structures onto a light-sensitive material,
wherein at least one member selected from the group consisting of the illumination optical unit and the projection optical unit comprises a component according to claim 1.

* * * * *

UNITED STATES PATENT AND TRADEMARK OFFICE
CERTIFICATE OF CORRECTION

| | |
|---|---|
| PATENT NO. | : 10,866,528 B2 |
| APPLICATION NO. | : 16/458709 |
| DATED | : December 15, 2020 |
| INVENTOR(S) | : Thomas Wolfsteiner et al. |

It is certified that error appears in the above-identified patent and that said Letters Patent is hereby corrected as shown below:

In the Specification

Column 10, Line 54, delete "poly-amide." and insert -- polyamide. --.

Signed and Sealed this
Ninth Day of March, 2021

Drew Hirshfeld
*Performing the Functions and Duties of the
Under Secretary of Commerce for Intellectual Property and
Director of the United States Patent and Trademark Office*